(12) United States Patent
Lv

(10) Patent No.: US 10,249,760 B2
(45) Date of Patent: Apr. 2, 2019

(54) THIN FILM TRANSISTOR AND LIQUID CRYSTAL DISPLAY PANEL

(71) Applicant: Shenzhen China Star Optoelectronics Technology Co., Ltd., Shenzhen, Guangdong (CN)

(72) Inventor: Xiaowen Lv, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 121 days.

(21) Appl. No.: 15/123,646

(22) PCT Filed: Jul. 20, 2016

(86) PCT No.: PCT/CN2016/090589
§ 371 (c)(1),
(2) Date: Sep. 5, 2016

(87) PCT Pub. No.: WO2017/219422
PCT Pub. Date: Dec. 28, 2017

(65) Prior Publication Data
US 2018/0175211 A1    Jun. 21, 2018

(30) Foreign Application Priority Data
Jun. 21, 2016   (CN) .......................... 2016 1 04522917

(51) Int. Cl.
*H01L 29/786* (2006.01)
*G02F 1/1368* (2006.01)
(Continued)

(52) U.S. Cl.
CPC ...... *H01L 29/78609* (2013.01); *G02F 1/1368* (2013.01); *H01L 29/41733* (2013.01);
(Continued)

(58) Field of Classification Search
CPC ............. H01L 29/786; H01L 27/78609; H01L 29/41733; H01L 29/66742; H01L 29/78618
See application file for complete search history.

(56) References Cited

U.S. PATENT DOCUMENTS

2010/0032665 A1   2/2010   Yamazaki et al.
2010/0302492 A1   12/2010  Kubota et al.
(Continued)

FOREIGN PATENT DOCUMENTS

CN   101782702 A   7/2010
CN   102231027 A   11/2011
(Continued)

*Primary Examiner* — Phuc Dang
(74) *Attorney, Agent, or Firm* — Andrew C. Cheng

(57) ABSTRACT

The disclosure discloses a thin film transistor and a manufacturing method thereof, a liquid crystal display panel, a transition pattern is disposed between a doping pattern and a source electrode pattern, the transition pattern covers sidewalls of the source electrode pattern and the drain electrode pattern respectively to insulate an active pattern and the sidewalls of the source electrode pattern and the drain electrode pattern in direct contact, so as to reduce leakage current of a TFT. Moreover, two sides of the transition pattern adjacent to the active pattern are covered by the doping pattern, which can reduce contact impendence of the active pattern and the source electrode pattern as well as the drain electrode pattern, so as to prevent the problem of insufficient charge of the TFT.

10 Claims, 2 Drawing Sheets

(51) Int. Cl.
*H01L 29/417* (2006.01)
*H01L 29/66* (2006.01)

(52) U.S. Cl.
CPC ...... *H01L 29/66742* (2013.01); *H01L 29/786* (2013.01); *H01L 29/78618* (2013.01)

(56) References Cited

U.S. PATENT DOCUMENTS

| | | |
|---|---|---|
| 2011/0068340 A1 | 3/2011 | Lee et al. |
| 2011/0212581 A1 | 9/2011 | Jung et al. |
| 2012/0007086 A1 | 1/2012 | Oh et al. |
| 2015/0318311 A1* | 11/2015 | Cheng .................. H01L 27/124 257/43 |
| 2015/0323833 A1 | 11/2015 | Xie |
| 2016/0020333 A1* | 1/2016 | Gao .................. H01L 29/78678 257/71 |
| 2016/0291425 A1 | 10/2016 | Ma |

FOREIGN PATENT DOCUMENTS

| | | |
|---|---|---|
| CN | 202600306 U | 12/2012 |
| CN | 103969899 A | 8/2014 |
| CN | 104183603 A | 12/2014 |

* cited by examiner

THIN FILM TRANSISTOR AND LIQUID CRYSTAL DISPLAY PANEL

FIELD OF THE DISCLOSURE

The disclosure relates to a liquid crystal display technical field, and more particularly to a thin film transistor and a manufacturing method thereof, and a liquid crystal display panel with the thin film transistor.

BACKGROUND OF THE DISCLOSURE

In design of a thin film transistor (TFT) with an active pattern formed by amorphous silicon (a-Si), as a photosensitive material, the amorphous silicon can be easily irradiated by backlight to affect electrical stability of the TFT. Conventional TFT design generally adopts a conlanar structure to solve the problem, as shown in FIG. 1, a section of an active pattern 11 of a TFT 10 is disposed on a gate pattern $G_1$, other sections are respectively disposed on a source electrode pattern $S_1$ and a drain electrode pattern $D_1$, the metallic gate pattern $G_1$, source electrode pattern $S_1$ and drain electrode pattern $D_1$ are utilized to shade backlight, so as to prevent amorphous silicon in the active pattern 11 from illumination.

To the structure above, when the TFT 10 is electrified, a hole current can be formed in the active pattern 11, as the active pattern 11 is contacted to sidewalls of the source electrode pattern $S_1$ and the drain electrode pattern $D_1$ directly and convenient for conduction of the hole current, leakage current ($I_{off}$) of the TFT 10 can be considerable. Moreover, during etching to form the source electrode pattern $S_1$ and the drain electrode pattern $D_1$, sidewalls of the source electrode pattern $S_1$ and the drain electrode pattern $D_1$ adjacent to the active pattern 11 can occur metal under cut to form an undercut angle, which leads to contact impedance of the active pattern 11 and the source electrode pattern $S_1$ as well as the drain electrode pattern $D_1$ to be high, resulting in insufficient charge for the TFT 10.

SUMMARY OF THE DISCLOSURE

Accordingly, the disclosure provides a thin film transistor and a manufacturing method thereof, a liquid crystal display panel, which can reduce leakage current of the TFT, as well as contact impedance of the active pattern and the source electrode pattern, the drain electrode pattern, so as to prevent the problem of insufficient charge of the TFT.

A thin film transistor provided by the disclosure includes a substrate, a source electrode pattern and a drain electrode pattern separately disposed on the substrate, a first doping pattern and a second doping pattern respectively covering the source electrode pattern and the drain electrode pattern, and an active pattern contacting electrically with the first doping pattern and the second doping pattern respectively, a first transition pattern is disposed between the source electrode pattern and the first doping pattern, a second transition pattern is disposed between the drain electrode pattern and the second doping pattern, the first transition pattern and the second transition pattern respectively cover a sidewall of the source electrode pattern and a sidewall of the drain electrode pattern, so as to insulate the active pattern from the sidewall of the source electrode pattern and the sidewall of the drain electrode.

The first transition pattern and the second transition pattern are metal or metallic oxide.

Thicknesses of the first transition pattern and the second transition pattern are 100-500 angstroms.

The thin film transistor further includes a gate pattern and a gate insulation layer, the gate pattern is disposed between the source electrode pattern, the drain electrode pattern and the substrate, correspondingly to the active pattern. The gate insulation layer is applied to electrically insulate the gate pattern from the source electrode pattern and the drain electrode pattern. Or the gate pattern is disposed above the active pattern correspondingly, the gate insulation layer is applied to electrically insulate the gate pattern and the active pattern.

A liquid crystal display panel provided by the disclosure includes a thin film transistor, the thin film transistor includes a substrate, a source electrode pattern and a drain electrode pattern separately disposed on the substrate, a first doping pattern and a second doping pattern respectively covering the source electrode pattern and the drain electrode pattern, and an active pattern contacting electrically with the first doping pattern and the second doping pattern respectively, a first transition pattern is disposed between the source electrode pattern and the first doping pattern, a second transition pattern is disposed between the drain electrode pattern and the second doping pattern, the first transition pattern and the second transition pattern respectively cover a sidewall of the source electrode pattern and a sidewall of the drain electrode pattern, so as to insulate the active pattern from the sidewall of the source electrode pattern and the sidewall of the drain electrode.

The first transition pattern and the second transition pattern are metal or metallic oxide.

Thicknesses of the first transition pattern and the second transition pattern are 100-500 angstroms.

The thin film transistor further includes a gate pattern and a gate insulation layer, the gate pattern is disposed between the source electrode pattern, the drain electrode pattern and the substrate, correspondingly to the active pattern. The gate insulation layer is applied to electrically insulate the gate pattern from the source electrode pattern and the drain electrode pattern. Or the gate pattern is disposed above the active pattern correspondingly, the gate insulation layer is applied to electrically insulate the gate pattern and the active pattern.

A manufacturing method of a thin film transistor provided by the disclosure includes providing a substrate, forming and patterning a source drain electrode layer on the substrate, so as to form a source electrode pattern and a drain electrode pattern disposed separately, forming and patterning a transition layer and a doping layer on the substrate in sequence, so as to form a first transition pattern and a first doping pattern that cover the source electrode pattern, as well as a second transition pattern and a second doping pattern that cover the drain electrode pattern, the first transition pattern and the second transition pattern respectively cover sidewalls of the source electrode pattern and the drain electrode pattern, forming and patterning an active layer on the substrate, so as to form an active pattern electrically contacting with the first doping pattern and the second doping pattern respectively.

A step of forming and patterning a transition layer and a doping layer on the substrate in sequence includes patterning the transition layer and the doping layer by an identical mask.

A step of patterning the transition layer and the doping layer by an identical mask includes dry etching the doping layer and the transition layer in sequence by an identical mask, or first dry etching the doping layer, then wet etching the transition layer by the identical mask.

A step of forming and patterning a transition layer and a doping layer on the substrate in sequence includes forming a transition layer with a thickness of 100-500 angstroms and a doping layer with a thickness of 300-500 angstroms on the substrate in sequence.

According to the thin film transistor and the manufacturing method thereof, the liquid crystal display panel of the embodiments of the disclosure, the transition pattern is disposed between the doping pattern and the source electrode pattern, the drain electrode pattern, and the transition pattern covers the sidewalls of the source electrode pattern and the drain electrode pattern respectively, so as to insulate the active pattern and the sidewalls of the source electrode pattern and the drain electrode pattern, reducing leakage current of the TFT. Moreover, two sides of the transition pattern adjacent to the active pattern are covered by the doping pattern, which can reduce contact impedance of the active pattern and the source electrode pattern as well as the drain electrode pattern, so as to solve the problem of insufficient charge of the TFT.

DETAILED DESCRIPTION OF PREFERRED EMBODIMENTS

Embodiments of the disclosure are described in detail with reference to the accompanying drawings as follows.

Figure 2:
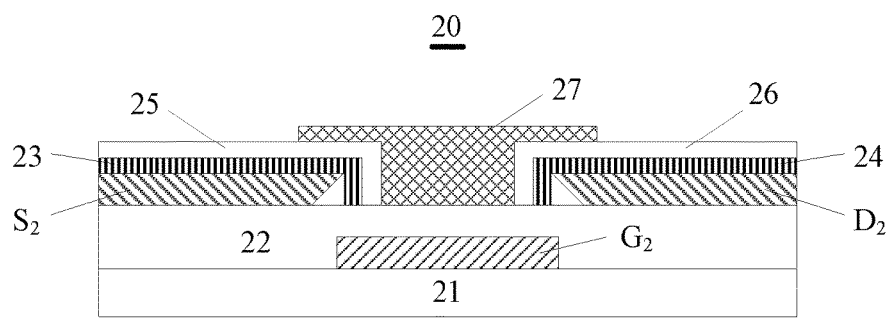
FIG. 2 is a cross-sectional, structural view of a thin film transistor according to an embodiment of the disclosure.

As shown in FIG. 2, FIG. 2 is a cross-sectional, structural view of a thin film transistor according to an embodiment of the disclosure, a thin film transistor 20 is bottom gate structural, including a substrate 21, a gate pattern $G_2$ and a gate insulation layer 22 disposed on the substrate 21, a source electrode pattern $S_2$ and a drain electrode pattern $D_2$, a first transition pattern 23 and a second transition pattern 24, a first doping pattern 25 and a second doping pattern 26, and an active pattern 27. The gate pattern $G_2$ is disposed between the source electrode pattern $S_2$, the drain electrode pattern $D_2$ and the substrate 21, correspondingly to the active pattern 27, specifically below the active pattern 27. The source electrode pattern $S_2$ and the drain electrode pattern $D_2$ are disposed separately on the substrate 21, the gate insulation layer 22 is applied to insulate the gate pattern $G_2$ from the source electrode pattern $S_2$ and the drain electrode pattern $D_2$ in electrical contact. The first transition pattern 23 is disposed between the source electrode pattern $S_2$ and the first doping pattern 25, the second transition pattern 24 is disposed between the drain electrode pattern $D_2$ and the second doping pattern 23, thereby the first doping pattern 25 covers the source electrode pattern $S_2$, the second doping pattern 26 covers the drain electrode pattern $D_2$.

Material of the active pattern 27 is a-Si, the active pattern 27 acts as a semiconductor layer of the thin film transistor 20. Material of the first doping pattern 25 and the second doping pattern 26 is doped a-Si, the first doping pattern 25 and the second doping pattern 26 act as ohmic contact layers of the thin film transistor 20. Accordingly, when the first transition pattern 23 and the second transition pattern 24 are metal or metallic oxide with stable electrical properties, such as molybdenum (Mo), titanium (Ti) and indium tin oxide (ITO), the first doping pattern 25 can be electrically contacted to the source electrode pattern $S_2$ by the first transition pattern 23, the second doping pattern 26 can be electrically contacted to the drain electrode pattern $D_2$ by the second transition pattern 24.

Figure 1:
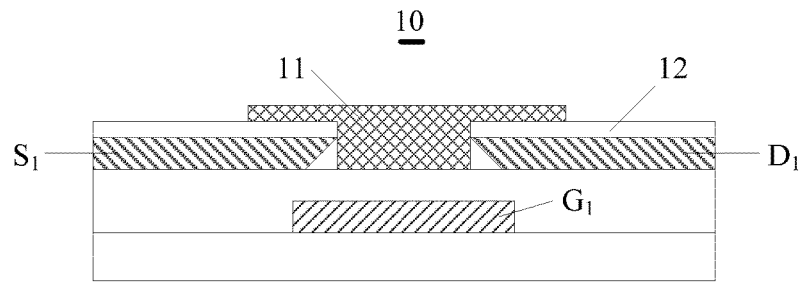
FIG. 1 is a cross-sectional, structural view of a thin film transistor according to an embodiment of the prior art.

Distinguishing from the thin film transistor 10 in the prior art shown in FIG. 1, in a structure of the thin film transistor 20 of the embodiment of the disclosure, the first transition pattern 23 is disposed between the source electrode pattern $S_2$ and the first doping pattern 25, a second transition pattern 24 is disposed between the drain electrode pattern $D_2$ and the second doping pattern 26, and the first transition pattern 23 covers a sidewall of the source electrode pattern $S_2$, the second transition pattern 24 covers a sidewall of the drain electrode pattern $D_2$, so as to insulate the active pattern 27 from the sidewall of the source electrode pattern $S_2$ and the sidewall of the drain electrode pattern $D_2$ in direct contact. Moreover, as the first doping pattern 25 and the second doping pattern 26 respectively cover the first transition pattern 23 and the second transition pattern 24, transmission of hole current from the active pattern 27 to the source electrode pattern $S_2$ and the drain electrode pattern $D_2$ can be inhibited, so as to reduce leakage current of the thin film transistor 20.

Furthermore, though the first transition pattern 23 and the second transition pattern 24 formed by etching can form an undercut angle on a sidewall adjacent to an active pattern 11, the first transition pattern 23 and the second transition pattern 24 will be covered by the first doping pattern 25 and the second doping pattern 26 respectively, and as the first transition pattern 23 and the second transition pattern 24 are respectively contacted well with the source electrode pattern $S_2$ and the drain electrode $D_2$, the problem of high contact impendence of the active pattern 27 and the source electrode pattern $S_2$, drain electrode pattern $D_2$ caused by the undercut angle can be solved, so as to prevent a phenomenon of insufficient charge of the thin film transistor 20.

According to the cover and protection of the first doping pattern 25 and the second doping pattern 26 above, the embodiment of the disclosure can set thicknesses of the first transition pattern 23 and the second transition pattern 24 to be thin, such as 100-500 angstroms (Å), thicknesses of the first doping pattern 25 and the second doping pattern 26 are 300-500 angstroms. Moreover, the embodiment can further dispose a sum of the thicknesses of the first doping pattern 25 and the first transition pattern 23 and a sum of the thicknesses of the second doping pattern 26 and the second transition pattern 24 are both equal to a thickness of a doping pattern 12 shown in FIG. 1, retaining the thickness of the thin film transistor 20 of the embodiment of the disclosure, which is benefit for thin design.

Figure 3:
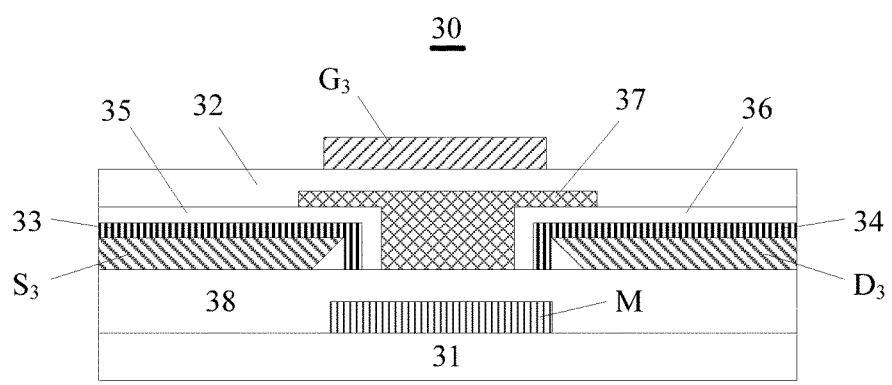
FIG. 3 is a cross-sectional, structural view of a thin film transistor according to another embodiment of the disclosure.

FIG. 3 is a cross-sectional, structural view of a thin film transistor according to another embodiment of the disclosure, a thin film transistor 30 is top gate structural, including a substrate 31, a source electrode pattern $S_3$ and a drain electrode pattern $D_3$ disposed on the substrate 31, a first transition pattern 33 and a second transition pattern 34, a first doping pattern 35 and a second doping pattern 36, an active pattern 37, a gate insulation layer 32 and a gate pattern $G_3$. Each doping pattern and each transition pattern are disposed identically to the embodiment as shown in FIG. 2, repeated description will be omitted herein. Variation is that the gate pattern $G_3$ of the embodiment is located above the active pattern 37 correspondingly, the gate insulation layer 32 is applied to electrically insulate the gate pattern $G_3$ from the active pattern 37. Moreover, in order to prevent backlight from radiating on the active pattern 37, a shade metallic layer M and an insulation layer 38 are disposed between the substrate 31 and a source drain electrode layer, the insulation layer 38 is applied to insulate the shade metallic layer M from a source electrode pattern $S_3$ and a drain electrode pattern $D_3$ in electrical contact.

In structural design of the embodiment, the first transition pattern 33 is disposed between the source electrode pattern $S_3$ and the first doping pattern 35, the second transition pattern 34 is disposed between the drain electrode pattern $D_3$ and the second doping pattern 36, and the first transition pattern 33 covers a sidewall of the source electrode pattern $S_3$, the second transition pattern 34 covers a sidewall of the drain electrode pattern $D_3$, so as to insulate the active pattern 37 from the sidewall of the source electrode pattern $S_3$ and the sidewall of the drain electrode $D_3$ in direct contact. Moreover, as the first doping pattern 35 and the second doping pattern 36 respectively cover the first transition pattern 33 and the second transition pattern 34, transmission of hole current from the active pattern 37 to the source electrode pattern $S_3$ and the drain electrode pattern $D_3$ can be inhibited, so as to reduce leakage current of the thin film transistor 30.

Figure 4:
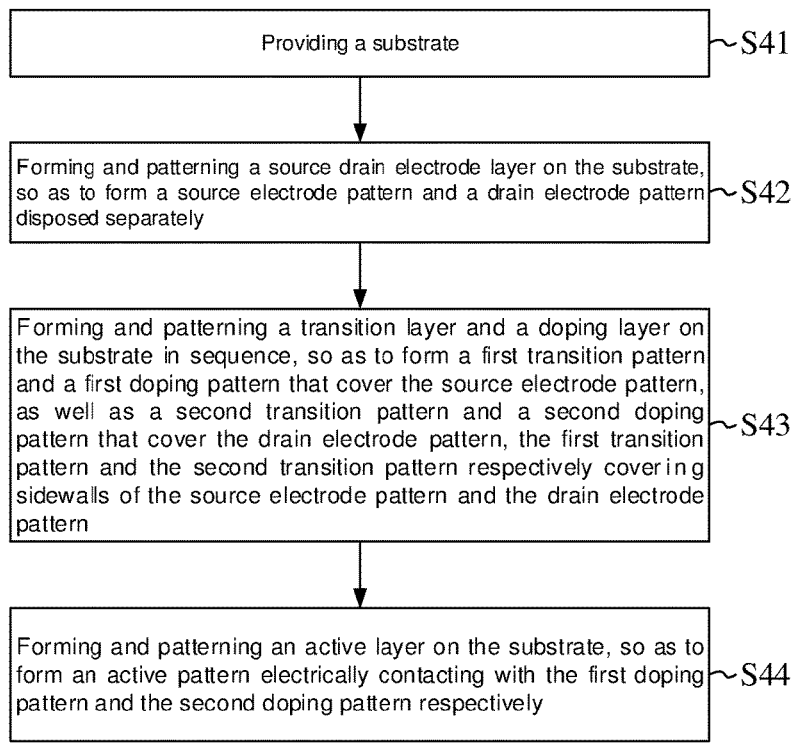
FIG. 4 is a flow chart of a manufacturing method of a thin film transistor according to an embodiment of the disclosure.

FIG. 4 is a flow chart of a manufacturing method of a thin film transistor according to an embodiment of the disclosure. As shown in FIG. 4, the manufacturing method of the embodiment includes:

S41, providing a substrate.

The substrate includes a glass substrate and others.

S42, forming and patterning a source drain electrode layer on the substrate, so as to form a source electrode pattern and a drain electrode pattern disposed separately.

The embodiment can adopt any method such as chemical vapor deposition (CVD) or sputter to form the source drain electrode layer on the substrate.

S43, forming and patterning a transition layer and a doping layer on the substrate in sequence, so as to form a first transition pattern and a first doping pattern that cover the source electrode pattern, as well as a second transition pattern and a second doping pattern that cover the drain electrode pattern, the first transition pattern and the second transition pattern respectively cover sidewalls of the source electrode pattern and the drain electrode pattern.

Optionally, a transition layer with a thickness of 100-500 angstroms and a doping layer with a thickness of 300-500 angstroms are formed on the substrate in sequence. Moreover, the transition layer and the doping layer are patterned by an identical mask, specifically, the doping layer and the transition layer can be dry etched by an identical mask in sequence, or the doping layer is dry etched first, then the transition layer is wet etched by the identical mask.

S44, forming and patterning an active layer on the substrate, so as to form an active pattern electrically contacting with the first doping pattern and the second doping pattern respectively.

Methods of pattern employed by the embodiments include etching and others.

Figure 5:
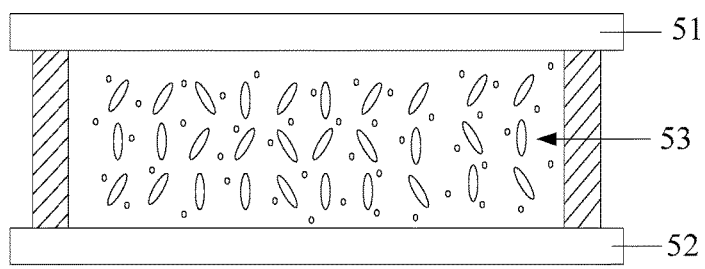
FIG. 5 is a cross-sectional, structural view of a liquid crystal display panel according to an embodiment of the disclosure.

The embodiment of the disclosure further provides a liquid crystal display panel. As shown in FIG. 5, a liquid crystal display panel 50 includes an array substrate 51 (also known as a thin film transistor substrate) and a color filter (CF) substrate 52 disposed separately, and liquid crystals 53 (liquid crystal molecules) in-between, the liquid crystals 53 are located in a liquid crystal cell formed by overlapping the array substrate 51 and the color filter substrate 52. The array substrate 51 includes the thin film transistor of any embodiment above, so that the same advantages will be obtained.

Above are embodiments of the disclosure, which do not limit the scope of the disclosure, any modifications, equivalent replacements or improvements within the spirit and principles of the embodiments described above should be covered by the protected scope of the disclosure.

What is claimed is:

1. A thin film transistor, wherein the thin film transistor comprises:
    a substrate,
    a source electrode pattern and a drain electrode pattern separately disposed on the substrate,
    a first doping pattern and a second doping pattern respectively comprising a first portion and a second portion, wherein the first portions are respectively covered on the source electrode pattern and the drain electrode pattern, and
    an active pattern contacting electrically with the first doping pattern and the second doping pattern respectively,
    wherein the second portions of the first doping pattern and the second doping pattern are disposed adjacent to a sidewall of the source electrode pattern and a sidewall of the drain electrode pattern, respectively, a first transition pattern is disposed between the source electrode pattern and the first doping pattern, a second transition pattern is disposed between the drain electrode pattern and the second doping pattern, the first transition pattern and the second transition pattern respectively cover the sidewall of the source electrode pattern and the sidewall of the drain electrode pattern, and the sidewalls of the first doping pattern and the second doping pattern are adjacent to the active pattern, so as to insulate the active pattern from the sidewall of the source electrode pattern and the sidewall of the drain electrode.

2. The thin film transistor according to claim 1, wherein the first transition pattern and the second transition pattern are metal or metallic oxide.

3. The thin film transistor according to claim 1, wherein thicknesses of the first transition pattern and the second transition pattern are 100-500 angstroms.

4. The thin film transistor according to claim 1, wherein the thin film transistor further comprises a gate pattern and a gate insulation layer, the gate pattern is disposed between the source electrode pattern, the drain electrode pattern and the substrate, correspondingly to the active pattern, the gate insulation layer is applied to electrically insulate the gate pattern from the source electrode pattern and the drain electrode pattern; or the gate pattern is disposed above the active pattern correspondingly, the gate insulation layer is applied to electrically insulate the gate pattern and the active pattern.

5. The thin film transistor according to claim 1, wherein a part of the active pattern is disposed between the source electrode pattern and the drain electrode pattern and contacted electrically with the second portions of the first doping pattern and the second doping pattern, and remaining part of the active pattern is respectively disposed over the source electrode pattern and the drain electrode pattern and contacted electrically with the first portions of the first doping pattern and the second doping pattern.

6. The thin film transistor according to claim 1, wherein a first undercut angle is formed on the sidewalls of the source electrode pattern and the drain electrode pattern, respectively, and a second undercut angle is formed on the first transition pattern and the second transition pattern, respectively, and the second undercut angles on the first transition pattern and the second transition pattern is adjacent to the respective sidewall of the source electrode pattern and the drain electrode pattern.

7. A liquid crystal display panel, wherein the liquid crystal display panel comprises a thin film transistor, the thin film transistor comprises:
   a substrate,
   a source electrode pattern and a drain electrode pattern separately disposed on the substrate,
   a first doping pattern and a second doping pattern respectively comprising a first portion and a second portion, wherein the first portions are respectively covered on the source electrode pattern and the drain electrode pattern, and
   an active pattern contacting electrically with the first doping pattern and the second doping pattern respectively,
   wherein the second portions of the first doping pattern and the second doping pattern are disposed adjacent to a sidewall of the source electrode pattern and a sidewall of the drain electrode pattern, respectively, a first transition pattern is disposed between the source electrode pattern and the first doping pattern, a second transition pattern is disposed between the drain electrode pattern and the second doping pattern, the first transition pattern and the second transition pattern respectively cover the sidewall of the source electrode pattern and the sidewall of the drain electrode pattern, and the sidewalls of the first doping pattern and the second doping pattern are adjacent to the active pattern, so as to insulate the active pattern from the sidewall of the source electrode pattern and the sidewall of the drain electrode.

8. The liquid crystal display panel according to claim 7, wherein the first transition pattern and the second transition pattern are metal or metallic oxide.

9. The liquid crystal display panel according to claim 7, wherein thicknesses of the first transition pattern and the second transition pattern are 100-500 angstroms.

10. The liquid crystal display panel according to claim 7, wherein the thin film transistor further comprises a gate pattern and a gate insulation layer, the gate pattern is disposed between the source electrode pattern, the drain electrode pattern and the substrate, correspondingly to the active pattern, the gate insulation layer is applied to electrically insulate the gate pattern from the source electrode pattern and the drain electrode pattern; or the gate pattern is disposed above the active pattern correspondingly, the gate insulation layer is applied to electrically insulate the gate pattern and the active pattern.

* * * * *